United States Patent
Faley et al.

(10) Patent No.: US 7,221,156 B2
(45) Date of Patent: May 22, 2007

(54) MAGNETIC FLOW SENSOR COMPRISING A MAGNETIC FIELD CONDUCTOR AND A HOLE DIAPHRAGM

(75) Inventors: Mikhail Faley, Jülich (DE); Egon Zimmermann, Inden (DE); Ulrich Poppe, Düren (DE); Knut Urban, Jülich (DE); Horst Halling, Pier (DE); Helmut Soltner, Inden (DE); Bernd Jungbluth, Aachen (DE); Rolf Speen, Jülich (DE); Walter Glaas, Elsdorf (DE)

(73) Assignee: Forschungszentrum Julich GmbH, Julich (DE)

( * ) Notice: Subject to any disclaimer, the term of this patent is extended or adjusted under 35 U.S.C. 154(b) by 0 days.

(21) Appl. No.: 10/547,943

(22) PCT Filed: Feb. 6, 2004

(86) PCT No.: PCT/DE2004/000199

§ 371 (c)(1),
(2), (4) Date: Apr. 28, 2006

(87) PCT Pub. No.: WO2004/079384

PCT Pub. Date: Sep. 16, 2004

(65) Prior Publication Data

US 2006/0244444 A1  Nov. 2, 2006

(30) Foreign Application Priority Data

Mar. 5, 2003 (DE) ................ 103 09 810

(51) Int. Cl.
*G01R 33/02* (2006.01)
*G01R 33/035* (2006.01)

(52) U.S. Cl. ...................... 324/248; 505/846
(58) Field of Classification Search ............... 324/248; 505/846

See application file for complete search history.

(56) References Cited

U.S. PATENT DOCUMENTS 6,211,673 B1   4/2001   Gerbert et al.

FOREIGN PATENT DOCUMENTS

DE   199 15 226   10/2000
EP   0 916 961    5/1999

*Primary Examiner*—Bot LeDynh
(74) *Attorney, Agent, or Firm*—Andrew Wilford

(57) ABSTRACT

The invention relates to a magnetic flow sensor (1, 21, 51) comprising a) a loop-shaped magnetic field conductor comprising a point (2, 22, 32, 52) which expands to form a bar or a film (3, 23, 52), a loop-shaped part (3a, 23a, 53a) and at least one part (4, 24, 54', 54") which guides back the magnetic field lines of the probe, b) SQUID (7, 27, 57), c) and a diaphragm (5, 25, 35, 55) comprising a hole (6, 26, 36, 56), whereby the part (4, 24, 54', 54") which guides the magnetic field lines of the probe back to the loop-shaped magnetic field conductor is connected to the diaphragm (5, 25, 35, 55).

14 Claims, 6 Drawing Sheets

MAGNETIC FLOW SENSOR COMPRISING A MAGNETIC FIELD CONDUCTOR AND A HOLE DIAPHRAGM

CROSS REFERENCE TO RELATED APPLICATIONS

This application is the U.S. national phase of PCT application PCT/DE2004/000199 filed Feb. 6, 2004 with a claim to the priority of German patent application 10309810.0 itself filed Mar. 5, 2003.

FIELD OF THE INVENTION

The invention relates to a magnetic flux sensor for determining a local flux distribution and which has a magnetic field conductor and a hole diaphragm.

BACKGROUND OF THE INVENTION

In recent years various raster microscopes using SQUID (Superconducting Quantum Interference Device) sensors have been developed. A magnetic sample is moved beneath the SQUID so that the local variations in the magnetic flux (magnetic field map of the sample) can be determined. Microscopes with high temperature superconductors (HTS) SQUIDS which operate at 77K are better for the measurement of magnetic fields of samples at room temperature than low temperature superconducting SQUIDS since for good field resolution and locality or position resolution, a reduced distance between the sample and the SQUID sensor is especially important. This distance limits the spatial resolution of SQUID microscopes to about 50 μm. To overcome this drawback, in SQUID microscopes, the SQUIDS are combined with ferromagnetic magnetic field conductors. These ferromagnetic field conductors generally have lengths of several millimeters and are formed as soft magnetic rods with a fine point or tip at the location of the sample.

From DE 195 19 480 A1, a magnetic field sensor has become known. This magnetic field sensor is comprised of a rod made from a soft magnetic ferromagnetic material with a tip or point and serving as a magnetic field conductor, as well as a DC-SQUID serving as the detector. A disadvantage here is that the magnetic field sensor is susceptible to noise fields since the entire rod, above all in the case of magnetic field distributions produced by current flow through the conductor strips, functions as an antenna. The length of the rod limits the spatial resolution of the sensor strongly.

From DE 199 15 226, a magnetic flux sensor has become known with a looped-shaped magnetic conductor and a detector formed as a DC-SQUID in which a magnetic flux arising in the magnetic field conductor can be registered. The magnetic field conductor comprises a high permeability foil or a thin film. A drawback of this magnetic flux sensor is also that it does not have a high spatial resolution.

OBJECT OF THE INVENTION

The object of the invention is to provide a magnetic sensor with high resolution.

SUMMARY OF THE INVENTION

The object is achieved with a magnetic flux sensor that comprises a magnetic field conductor. The magnetic field conductor has a tip or point for detecting the magnetic field lines of a sample P. The tip widens toward a rod or to a foil. The magnetic field conductor guides the magnetic flux from the location of the sample to the SQUID where it is measured. The magnetic flux sensor comprises, in addition, a diaphragm with a hole. The hole diaphragm determines the resolution of the magnetic flux sensor.

The tip of the loop-shaped magnetic field conductor is advantageously located as its center in the so-called space region of the hole diaphragm. The space region is defined as the approximately spherically shaped region or zone space, with a diameter which corresponds to that of the hole of the hole diaphragm. The centrum or center of the ball coincides with the centrum or center of the hole of hole diaphragm. This advantageously provides a superior local resolution for the magnetic flux sensor.

Such a magnetic flux sensor is especially suitable for the measurement of the z-component of wires, conductive strips or tracks and electronic components traversed by electric current and magnetic components and magnetic storage media.

In a further feature of the invention, the magnetic field conductor and/or the hole diaphragm are advantageously comprised of high permeability material, for example, material with a permeability>1000. This results in a reduced magnetic resistance of the magnetic field conductor of the hole diaphragm and therewith a largely low-loss guidance of the magnetic flux to the SQUID or to the sample.

The magnetic field conductor can, in addition, have a loop-shaped part with at least one feedback part which feeds back the magnetic field lines of the sample from the SQUID to the hole diaphragm.

The feedback part of the loop-shaped magnetic field conductor which feeds back the magnetic lines of the sample is then connected with the hole diaphragm of the magnetic flux sensor.

The loop-shaped magnetic field conductor can have an interruption at the SQUID, for example, in the form of a gap.

As a result of this gap, the SQUID need not have a bore. The formation of bores in the SQUID is comparatively difficult. In this case, the tip must be fastened in a suitable manner, for example, on a cryostat. The magnetic coupling between both ends of the gap should then be as large as it can possibly be made since the introduction of additional air gaps is detrimental with respect to the magnetic resistance of the loop and thus the sensitivity of a microscope. For this purpose, overlapping foils with the SQUID lying between them can advantageously be used.

For the thermal insulation, the magnetic field lines of the sample to the SQUID and/or the magnetic field lines of the feedback part from the sample of the loop shaped metal field conductor can have further gaps. In this manner, advantageously, a part of the loop-shaped magnetic field conductor can be cooled and the part at the sample can be held at room temperature.

For better magnetic shielding of the SQUID against stray field or noise fields, a widening part of the magnetic field conductor opens, in accordance with a further feature of the invention to a rod or to a foil in a bottom plate. In this case, the bottom plate can provide the loop-shaped part of the magnetic field conductor. From the bottom plate, the magnetic flux can be guided back symmetrically to the hole diaphragm.

The magnetic flux sensor according to the invention has in an especially advantage feature of the invention, a local resolution which is smaller than 20 micrometers.

A SQUID microscope includes a magnetic flux sensor according to the invention.

The SQUID can be a DC-SQUID magnetometer or a DC-SQUID gradiometer. The SQUID measures the magnitude of the magnetic flux. For that purpose, the magnetic flux is coupled into a so-called flux antenna of the SQUID.

BRIEF DESCRIPTION OF THE DRAWING

In the following, the invention will be described in greater detail based upon several embodiments or examples and the accompanying drawing, wherein.

SPECIFIC DESCRIPTION

Figure 1:
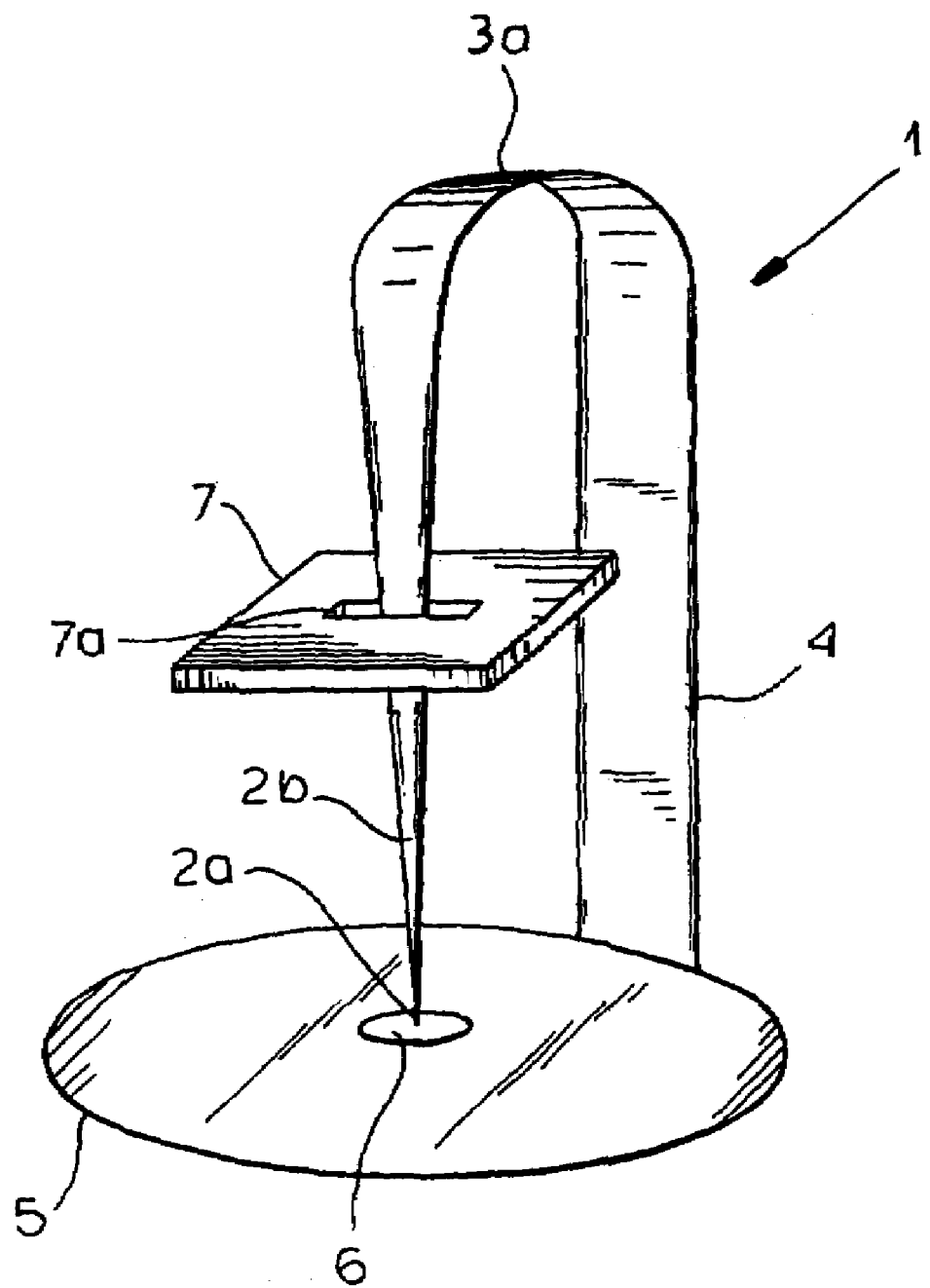
FIGS. 1 and 2 are perspective views of magnetic flux sensors according to the invention.

A preferred embodiment of the magnetic flux sensor is shown in a perspective view in FIG. 1.

It has a magnetic field conductor with a tip or point 2a at the end of a highly permeable rod 2b. The rod 2b widens away from the tip 2a and communicates with a loop-shaped part 3a of the magnetic field conductor at its wide end. The magnetic field conductor has a feedback part 4 through which the magnetic field lines of the sample can be fed back. The magnetic flux sensor 1 comprises, in addition, a hole diaphragm 5 with a hole 6 as well as a SQUID 7 with an opening 7a. Them magnetic field conductor can guide the magnetic field from a sample (not shown) below the hole diaphragm to a SQUID 7 and from there in a loop shape over the hole diaphragm 5 back to the sample. The hole diaphragm increases the spatial resolution of the magnetic flux 1 and serves also to shield it from stray or noise signals. The recycle enhances the sensitivity of the magnetic flux sensor.

Such a magnetic flux sensor advantageously can measure the z-component of a magnetic field produced by a sample. In this manner, the magnetic field sensor according to the invention is found to be especially suitable for the measurement of current carrying conductor strips or printed circuit board tracks.

The sample can, for example, be a wire traversed by an electric current or a printed circuit board conductive track whose magnetic field can be measured at room temperature.

The loop-shaped magnetic field conductor enables the measurement of samples at room temperature with elevated spatial resolution and sensitivity. The magnetic flux is guided through the magnetic field guide, very effectively to a cooled SQUID 7 and enables the measurement of a sample at room temperature with a cooled SQUID without requiring that the sample also be cooled.

For this purpose, the loop-shaped magnetic field guide and its hole diaphragm 7 advantageously can be composed of highly permeable foil or thin film or wire of, for example, permalloy or another amorphous soft magnetic material. Advantageously, such materials have been found to be available with very high permeability>1000, especially amorphous materials.

Figure 2:
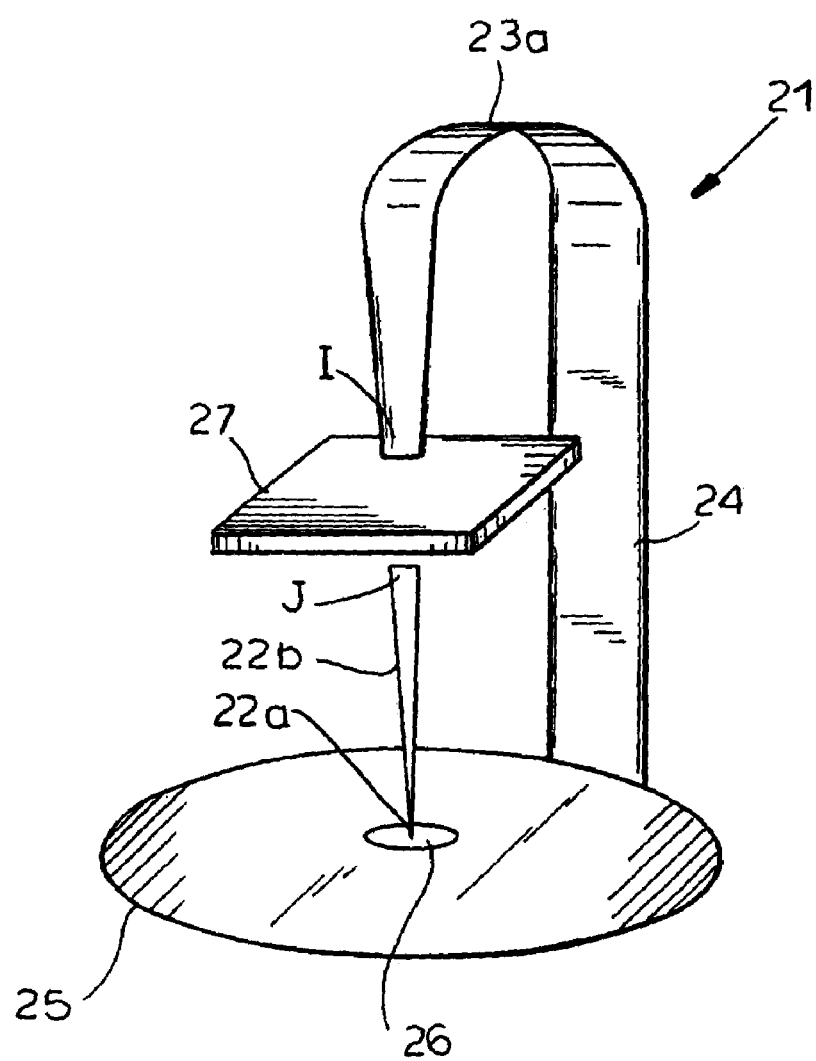

FIG. 2 also shows, in a perspective view, an advantageous configuration of the invention. By contrast with FIG. 1, the SQUID 27 of the magnetic flux sensor 21, has no bore or passage through which the loop-shaped magnetic field guide extends. Instead of such an opening, the part 22b which widens toward a rod or to a foil of the loop-shaped magnetic field conductor is interrupted at the SQUID 27. Advantageously, this has the effect of eliminating the need for a bore through the SQUID 27 since the formation of such a bore is comparatively difficult to do in practice. A good magnetic coupling between the ends I and J of the gap can be achieved by overlapping foils in an advantageous manner.

Figure 3A:
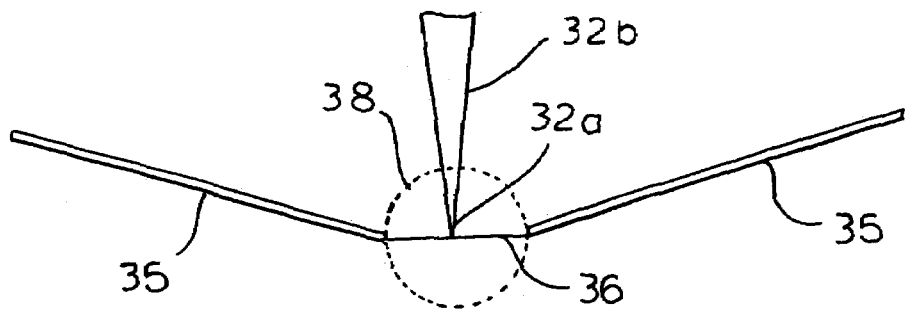
FIGS. 3a, 3b, and 3c are schematic views of details of the instant invention.

In FIG. 3, the measurement principles of the magnetic flux sensor according to the invention have been illustrated.

To insure a high spatial resolution of the magnetic flux center, the tip or point 32a is located in the center and at the height of the hole 36 in the hole diaphragm 35. The tip 32a is, in an especially advantageous configuration of the invention, located in the spatial region 38 of the hole diaphragm 35. The spatial region or zone 38 is configured as a ball-shaped or spherically extended space with a diameter which corresponds to that of the hole 36 and has been shown in FIG. 3a by dots. The center or centrum of the spatial region or zone 35 coincides with the center or centrum of the hole 36.

The tip 32a should be positioned not too far above the center in the direction of the SQUID since then only a fraction of the magnetic flux of the sample beneath the tip will be acquired by the tip 37a and the magnetic flux sensor would then have a reduced sensitivity.

A tip 32a positioned below the center toward the sample P (see FIGS. 3b and 3c) will result in a poorer spatial resolution of the magnetic flux sensor. The tip 32a would then not only respond to the local magnetic field of the sample P directly below the tip but also would measure neighboring magnetic flux from sample parts which have been removed or are further away.

What is desired, therefore, is a position of the tip 32a in the spatial zone 39 which will lead to especially high spatial resolution of the magnetic flux sensor and thus located at the center of the hole 36.

Figure 3B:
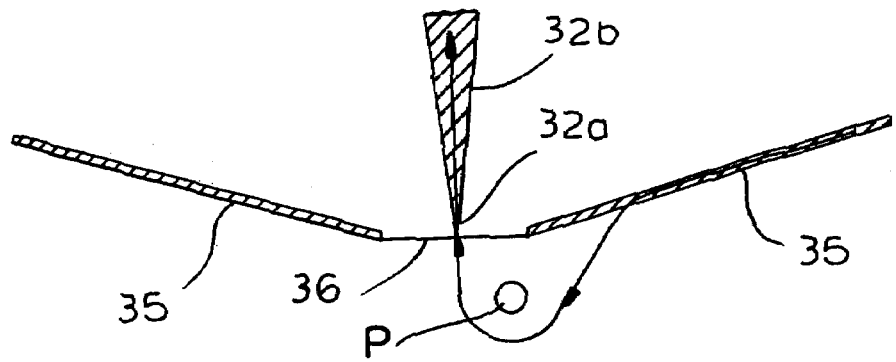

FIG. 3b shows the process of detecting magnetic field lines of a sample that, for example, a wire transferred by an electric current and represented by the arrow and its derivative in the direction of the SQUID (not shown) by the tip 32a indicated schematically.

Figure 3C:
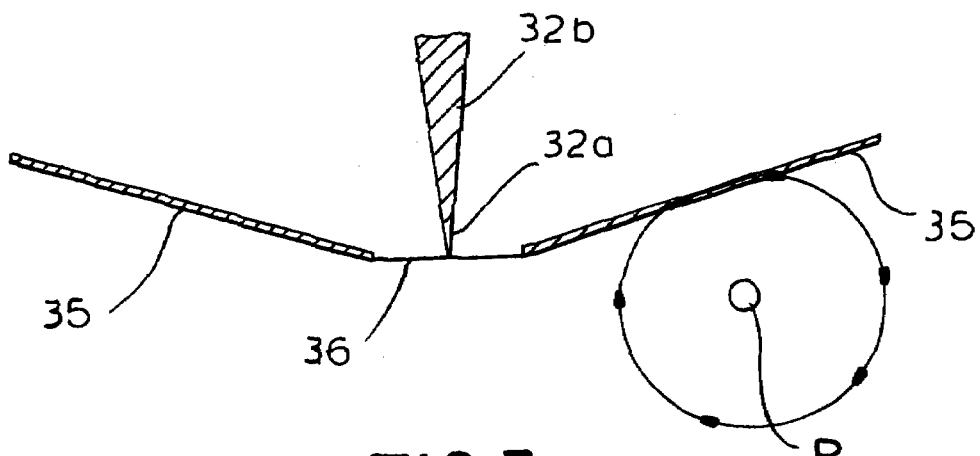

In FIG. 3c, by contrast, the shielding of the circular magnetic field lines represented by the arrows of the sample P below the diaphragm 35 by the diaphragm outside the spatial region or zone 38 has been shown. These magnetic field lines are no longer acquired by the tip 32a and thus are not evaluated by the SQUID.

Figure 4A:
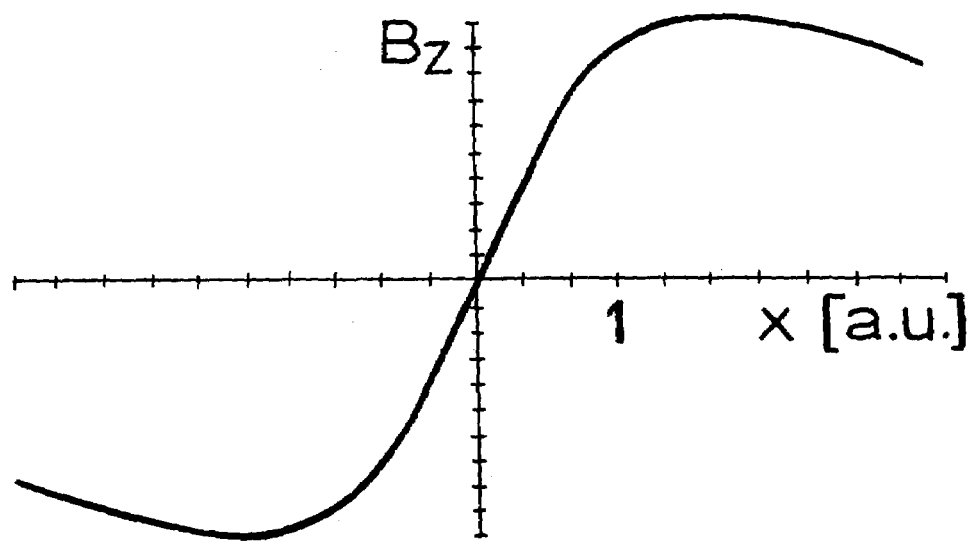
FIGS. 4a and 4b are diagrams illustrating the invention.
Figure 4B:
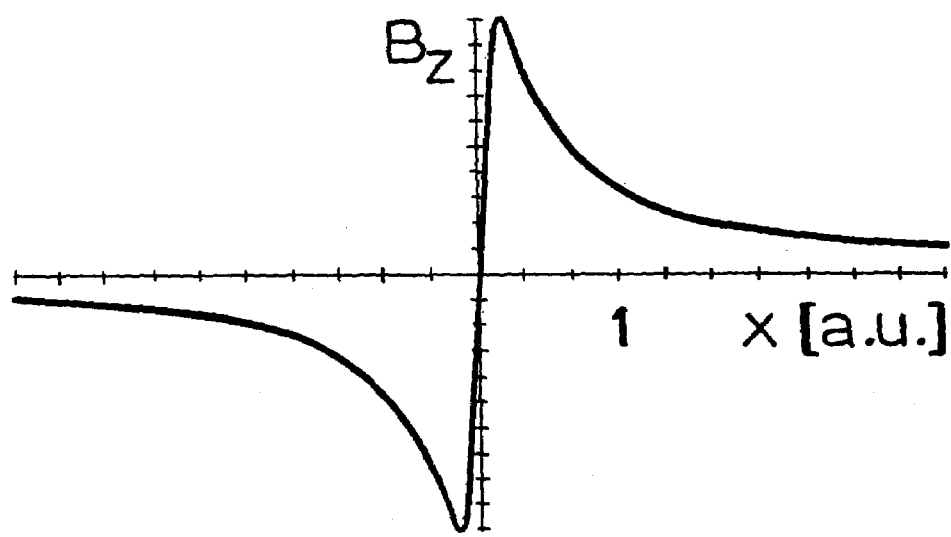

FIGS. 4a and 4b show schematically the z component of the magnetic field of a sample as a function of the x-position of the sample (current in y direction) without the diaphragm (FIG. 4a) and with diaphragm (FIG. 4b). The zero point of the x-position is found directly below the tip. The sample was a long straight conductor traversed by an electric current. FIGS. 4a and 4b clearly indicate that the local resolution of the magnetic flux sensor with the hole diaphragm is significantly better. This is a result of the shielding of the magnetic field conductor lying in the SQUID direction (FIG. 1, part 3) by the hole diaphragm (see for example 1, reference charger 5). It is only a part of the tip (see for example FIG. 1, reference character 2) in the spatial region or zone of the diaphragm hole (see FIG. 3a, reference character 38) that is sensitive. A reduction in the hole results therefore in a shorter sensitive part of the tip and thus an improvement in the spatial resolution.

Figure 5:
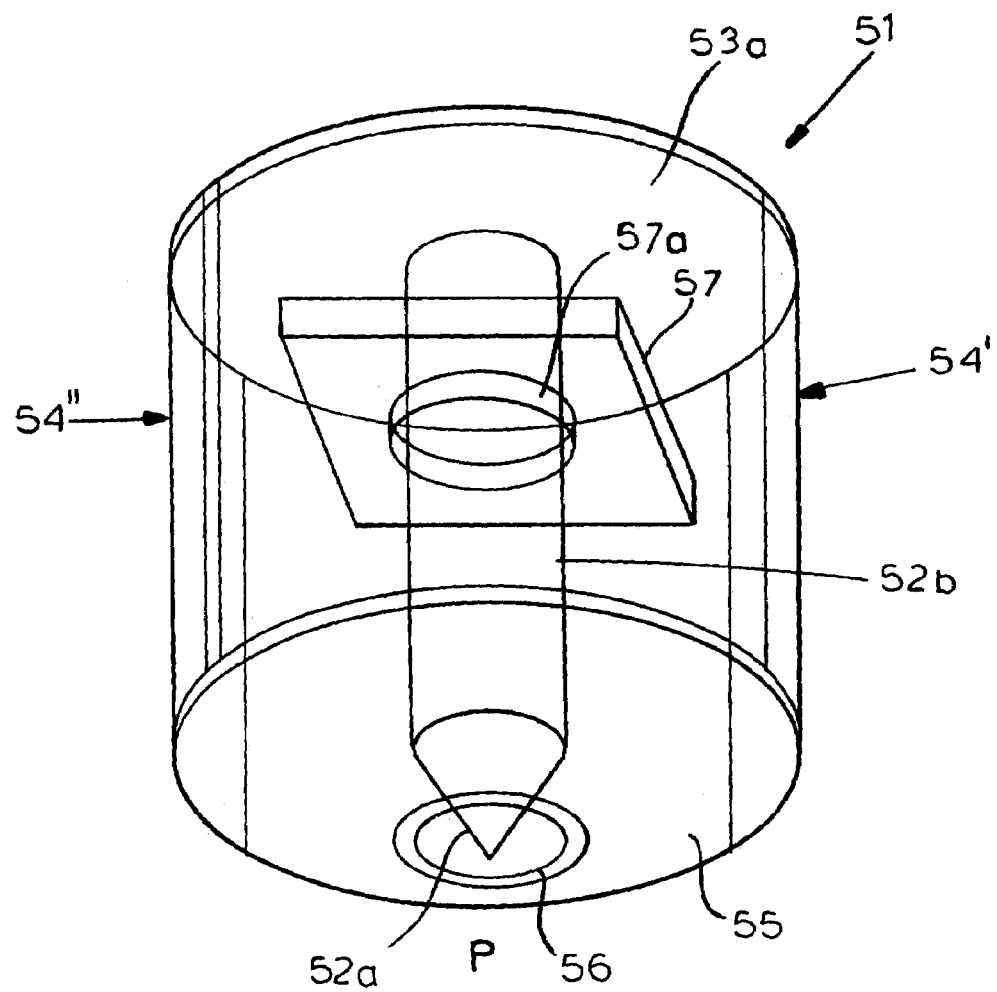
FIG. 5 is a view of another sensor according to the invention.

FIG. 5 shows a further preferred embodiment of a magnetic flux sensor 51. In this case the magnetic field conductor has a part 52b widening to a rod or to a foil above the SQUID 57 in a bottom plate 53a. Here, the bottom plate 53a forms the loop-shape portion of the magnetic field conductor. The tip 52a is located at the center of the hole 56 of the hole diaphragm 55 and therefore in its spatial zone or region. The tip 52a conducts the magnetic field lines (not shown) to the SQUID 57 which here has a bore 57a. The magnetic field lines are guided back to the sample P through the bottom plate 53a and two parts 54' and 54" forming magnetic field line feedback parts, of the loop shape magnetic field conductor, through the hole diaphragm 55. In this case, the magnetic field lines of the feed back parts 54' and 54" running to the sample, pass through two parts of a wall which connect the bottom plate 53a with the hole diaphragm 55. One can also conceive that the feed back parts 54' and 54" of the loop-forming magnetic field conductor can be continuous with one another as the system for guiding the magnetic field lines from the sample back to it and thus in the form somewhat of a closed can. This type of feedback shields the SQUID against noise and stray fields even better.

Figure 6A:
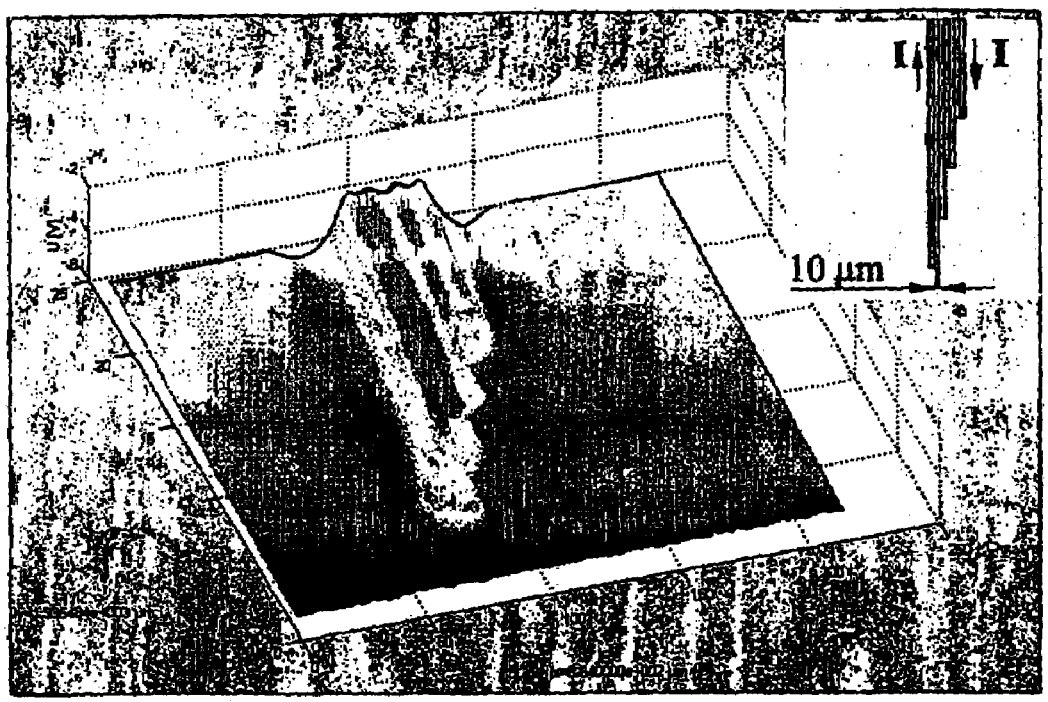
FIGS. 6a and 6b are examples of measurements according to the invention.
Figure 6B:
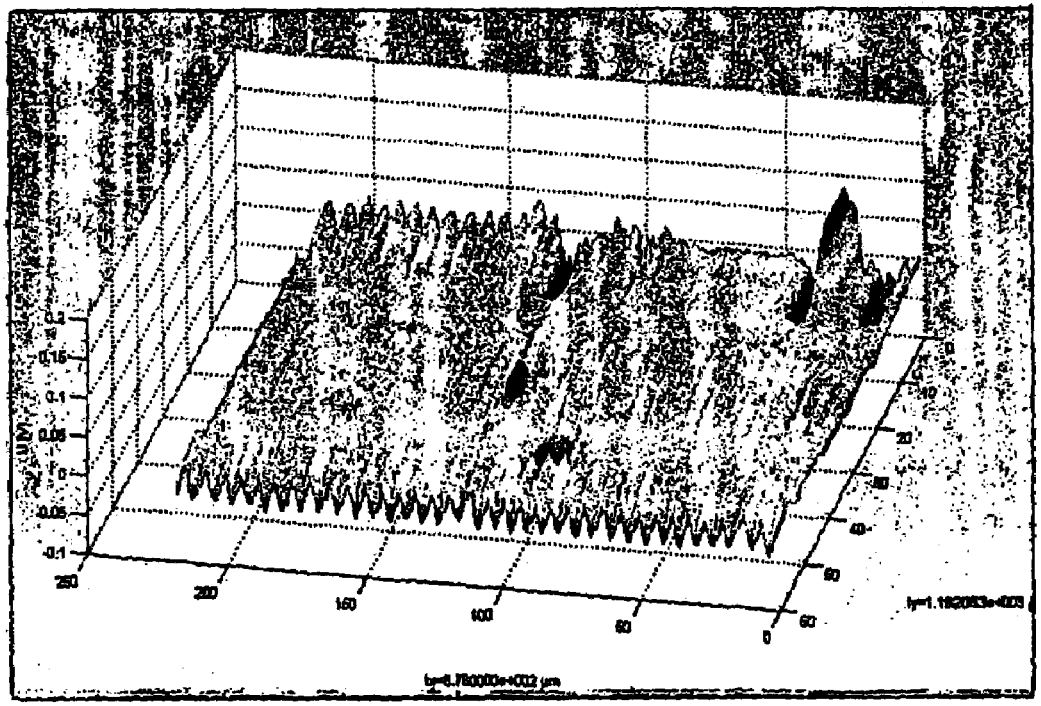

FIG. 6 shows examples of measurements of the z-component of the magnetic field over a two dimensional current distribution (FIG. 6a) or the field distribution over a floppy disk (FIG. 4b) in which the local resolution of a SQUID microscope with magnetic filled conductors and diaphragm is demonstrated. In FIG. 6a, the magnetic field distribution $B_z(x,y)$ at a constant distance above a current carrying meander-shaped track has been illustrated. At the upper right, the meander pattern with a conductive track width of 10 μm and a distance between the conductor tracks of 10 μm has been schematically shown. The fields of the individual conductive tracks can be separately resolved. In FIG. 6b, the measured magnetic field distribution ($B_z(x,y)$) has been shown at a constant spacing between three traces of the floppy disk. The magnetic field characteristics of individual bit patterns can be resolved. The illustrated x-,y- scan region in FIG. 6b amounts to about 0.8×1.2 mm. Both measured objects are at room temperature outside a SQUID-cooling cryostat. The sample tip spacing amounted to about 5 μm.

It is clear that a higher spatial resolution can be achieved even for samples with a spatially weakly declining magnetic field strength above the sample as, for example, with conductors traversed by an electric current.

Apart from the advantages already described, the system has the advantage that it can use amorphous soft magnetic materials for the loop-shaped magnetic field conductor with a sample shape without loss of permeability.

The materials are those which can be stored or shaped in the μm range by etching techniques, photolithography laser techniques and also vapor deposition techniques.

Amorphous materials show less noise and with high frequency magnetic fields, reduced eddy currents and as a result afford higher frequency band width of the measurement signals.

The invention claimed is:

1. A magnetic flux sensor (1, 21, 51) comprising a magnetic field conductor with a tip (2a, 22a, 32a, 52a) which widens toward a rod or toward a foil (2b, 22b, 32b, 52b) and a SQUID (7, 27, 57) for measuring the magnetic flux, characterized in that the magnetic flux sensor has a hole diaphragm (5, 25, 35, 55) with a hole (6, 26, 36, 56).

2. The magnetic flux sensor (1, 21, 51) according to claim 1 characterized in that the tip (2, 2a, 22a, 32a, 52a) is located in the space region or zone (38) of the hole (6, 26, 36, 56).

3. The magnetic flux sensor (1, 21, 51) according to claim 1 characterized in that the tip (2, 2a, 22a, 32a, 52a) is located at the center of the hole (6, 26, 36, 56).

4. The magnetic flux sensor (1, 21, 51) according to claim 1 characterized in that the magnetic field conductors and/or the hole diaphragm (5, 25, 35, 55) is comprised of a highly permeable material with a permeability>1000.

5. The magnetic flux sensor (1, 21, 51) according to claim 1 characterized by an amorphous soft material of the magnetic field conductor.

6. The magnetic flux sensor (1, 21, 51) according to claim 1 characterized by a gap in the magnetic field conductor at the SQUID (27).

7. The magnetic flux sensor (1, 21, 51) according to claim 1 characterized by at least one further gap in the widening part of the magnetic field conductor (2b, 23b, 33b, 53b) between the hole (6, 26, 56) and the SQUID (7, 27, 37).

8. The magnetic flux sensor (1, 21, 51) according to claim 1 characterized by a spatial resolution of less than 20 micrometer.

9. The sensor according to claim 1 characterized in that the magnetic field conductor has a look-shaped part (3a, 12a, 53aat) least one magnetic field line feedback part (4, 24, 54', 54") feeding back the magnetic field lines of the sample, which is connected with the hole diaphragm (5, 25, 35, 55).

10. The magnetic flux sensor according to claim 9 characterized in that the magnetic field line feedback part of the loop-shaped magnetic field conductors which feeds back the magnetic field lines of the sample is a closed one.

11. The magnetic flux sensor according to claim 9 characterized in that at lest one gap is provided in the feedback part (4, 24, 54', 54") of the loop-shaped magnet field conductor.

12. The magnetic flux sensor (1, 21, 51) according to claim 9 characterized in that the SQUID (7, 57) has an opening (7a, 57a) through which a flux antenna extends.

13. The magnetic flux sensor (1, 21, 51) according to claim 9 characterized in that the part of the magnetic field conductor widening to a rod or a foil (53b) opens in a bottom plate (53a) as a loop-shaped part.

14. A SQUID microscope comprising a magnetic flux sensor (1, 21, 51) according to claim 9.

* * * * *